US008165715B2

(12) United States Patent
Tanaka

(10) Patent No.: US 8,165,715 B2
(45) Date of Patent: Apr. 24, 2012

(54) SUBSTRATE PROCESSING SYSTEM, SUBSTRATE DETECTING APPARATUS, AND SUBSTRATE DETECTING METHOD

(75) Inventor: Yuichi Tanaka, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 137 days.

(21) Appl. No.: 12/784,735

(22) Filed: May 21, 2010

(65) Prior Publication Data

US 2010/0298966 A1 Nov. 25, 2010

(30) Foreign Application Priority Data

May 25, 2009 (JP) ................................. 2009-125265

(51) Int. Cl.
| G05F 7/00 | (2006.01) |
| B65G 1/00 | (2006.01) |
| B65B 21/02 | (2006.01) |
| B65B 69/00 | (2006.01) |
| B65G 65/04 | (2006.01) |
| B65G 65/34 | (2006.01) |

(52) U.S. Cl. .................... 700/218; 700/228; 414/331.15; 414/416.08

(58) Field of Classification Search .................. 700/213, 700/214, 218, 225, 226, 228; 702/94, 95; 414/331.14–331.18, 403, 404, 416.03, 416.08, 414/749.1, 754; 250/200, 559.01, 559.29; 156/345.24, 345.31

See application file for complete search history.

(56) References Cited

U.S. PATENT DOCUMENTS

| 4,643,629 | A  | * | 2/1987  | Takahashi et al. ........ 414/331.17 |
| 5,700,127 | A  | * | 12/1997 | Harada et al. ............. 414/416.08 |
| 5,980,194 | A  | * | 11/1999 | Freerks et al. ................. 414/754 |
| 6,144,926 | A  | * | 11/2000 | Ishizawa et al. ................. 702/94 |
| 6,520,733 | B1 | * | 2/2003  | Taniyama et al. .......... 414/749.5 |
| 6,526,329 | B2 | * | 2/2003  | Tateyama et al. ............. 700/213 |
| 6,821,073 | B1 | * | 11/2004 | Koguchi ....................... 414/403 |
| 6,830,651 | B2 | * | 12/2004 | Obikane .................. 156/345.31 |
| 7,202,491 | B2 | * | 4/2007  | Garssen et al. .......... 250/559.29 |
| 7,208,074 | B2 | * | 4/2007  | Mishima et al. ............. 205/191 |
| 7,363,107 | B2 | * | 4/2008  | Chae et al. .................... 700/226 |
| 8,078,311 | B2 | * | 12/2011 | Ogi .............................. 700/214 |

FOREIGN PATENT DOCUMENTS

JP         09017838 A   *   1/1997

(Continued)

OTHER PUBLICATIONS

Japanese Office Action dated Mar. 2, 2012 (with English translation).

Primary Examiner — Crystal J Barnes-Bullock
(74) Attorney, Agent, or Firm — Burr & Brown

(57) ABSTRACT

A substrate processing system 1 comprises a first detecting part 40 configured to detect unprocessed wafers W, and a second detecting part 50 configured to detect processed wafers W. The first detecting part 40 is configured to detect whether the unprocessed wafers W are respectively accommodated in respective accommodating portions 82 of a container 80 or not, and to detect accommodated conditions of the respective unprocessed wafers W accommodated in the respective accommodating portions 82. The second detecting part 50 is configured to collectively detect whether the processed wafers W are respectively accommodated in the respective accommodating portions 82 of the container 80.

15 Claims, 8 Drawing Sheets

FOREIGN PATENT DOCUMENTS

| | | | |
|---|---|---|---|
| JP | 10-116879 | A1 | 5/1998 |
| JP | 10-150094 | A1 | 6/1998 |
| JP | 10-321706 | A1 | 12/1998 |
| JP | 2000146864 | A * | 5/2000 |
| JP | 2002-184839 | A1 | 6/2002 |
| JP | 2003007798 | A * | 1/2003 |
| JP | 2005064055 | A * | 3/2005 |
| JP | 2009-065212 | A1 | 3/2009 |

* cited by examiner (a)

(b)

SUBSTRATE PROCESSING SYSTEM, SUBSTRATE DETECTING APPARATUS, AND SUBSTRATE DETECTING METHOD

CROSS REFERENCE TO RELATED APPLICATIONS

This application is based upon and claims the benefit of priority from the prior Japanese Patent Application No. 2009-125265 filed on May 25, 2009, the entire contents of which are incorporated herein by reference.

FIELD OF THE INVENTION

The present invention relates to a substrate processing system, a substrate detecting apparatus, and a substrate detecting method. In particular, the present invention relates to a substrate processing system, a substrate detecting apparatus, and the substrate detecting method, which are respectively configured to detect a unprocessed substrate and a processed substrate accommodated in a container.

BACKGROUND ART

As s substrate processing system for performing a process, such as a cleaning process, for a substrate, such as a semiconductor, wafer (hereinafter referred to as "wafer"), various types of systems have been conventionally known. In such a substrate processing system, a wafer container (hereinafter referred to as "container") such as a FOUP (Front Open Unified Pod), which accommodates a plurality of wafers arranged in a horizontal state in the up and down direction, is transferred from outside to the substrate processing system. Then, the plurality of unprocessed wafers are collectively brought out from the container and sent to a processing part of the substrate processing system. Thereafter, the plurality of wafers are subjected to a process such as a cleaning process by a batch method. Following thereto, the plurality of processed wafers are collectively transferred from the processing part to the vacant container, and the plurality of processed wafers are brought into the container.

Before the unprocessed wafers are brought out from the container, and after the processed wafers are brought into the container, the wafers in the container are detected. To be specific, the number of the wafers accommodated in the container is detected and/or whether the respective wafers are normally accommodated in the container is detected. As such a detecting apparatus for detecting wafers in a container, the invention disclosed in JP2009-65212A has been known.

In a conventional substrate processing system, a common detecting apparatus is used both before unprocessed wafers are brought out from a container and after processed wafers are brought into the container. In addition, when wafers accommodated in the container are detected, the detecting apparatus used in the conventional substrate processing system is adapted to detect whether the wafers are respectively accommodated in respective accommodating portions of the container or not, and to detect accommodated conditions of the respective wafers accommodated in the respective accommodating portions. This is because, when the container accommodating unprocessed wafers is transferred from outside to the substrate processing system, there is a case where some wafers are not normally accommodated in the container. In this case, when the wafer that are not normally accommodated in the container is brought out therefrom, various troubles may occur in the subsequent processing steps for the wafers.

On the other hand, when the processed wafers are returned from the processing part to the container, the wafers are normally brought into the container in general. Thus, when the processed wafers in the container are detected after the wafers have been brought into the container, it is sufficient to detect only the number of the wafers accommodated therein. However, as described above, since the same detecting apparatus is used both before the unprocessed wafers are brought out from the container and the processed wafers are brought into the container, the accommodated conditions of the respective processed wafers accommodated in the respective accommodating portions of the container (whether the wafers are normally accommodated or not) is also detected, even when the processed wafers accommodated in the container are detected. Thus, a time period required for detecting the wafers is prolonged.

The present invention has been made in view of the above circumstances. The object of the present invention is to provide a substrate processing system, a substrate detecting apparatus, and a substrate detecting method, which are advantageous in the following points. Namely, when substrates accommodated in a container are detected, since substrates in an unprocessed condition and substrates in a processed condition are detected by detecting parts that are different from each other, a detection result needed for the substrates in the respective conditions can be appropriately obtained. Further, a detection period for the substrates can be reduced, as compared with a single detecting part which detects both unprocessed substrates and processed substrates. Thus, a throughput of a process of the substrates can be improved.

SUMMARY OF THE INVENTION

The substrate processing system of the present invention is a substrate processing system configured to bring out substrates from a container in which a plurality of accommodating portions each of which can accommodate one substrate are arranged in an up and down direction, to process the substrates, and to return the processed substrates to the container, the substrate processing system comprising: a processing part configured to process the substrates; a first detecting part configured to detect, before the substrates are processed by the processing part, whether the substrates are respectively accommodated in the respective accommodating portions of the container or not, and to detect accommodated conditions of the respective substrates accommodated in the respective accommodating portions; and a second detecting part configured to collectively detect, after the substrates have been processed by the processing part, whether the substrates are respectively accommodated in the respective accommodating portions of the container or not.

In the substrate processing system of the present invention, the first detecting part may scan the respective substrates accommodated in the respective accommodating portions of the container, so as to detect whether the substrates are respectively accommodated in the respective accommodating portions of the container, and to detect accommodated conditions of the respective substrates accommodated in the respective accommodating portions, based on a scanning result.

At this time, the first detecting part may include a plurality of detecting components that are disposed with spaces therebetween along the up and down direction, and a driving mechanism configured to synchronically move the respective detecting parts in the up and down direction, and the respective detecting components of the first detecting part may detect the respective substrates accommodated in the respective accommodating portions of the container, while the detecting components are moved by the driving mechanism in the up and down direction.

In this case, each of the detecting components of the first detecting part may have a light emitting element and a light receiving element that are disposed such that each substrate accommodated in each accommodating portion is interposed between the light emitting element and the light receiving element along a horizontal direction, and each of the detecting components may detect each substrate based on a light reception condition of a light ray emitted from the light emitting element and received by the light receiving element, while the detecting component is moved by the driving mechanism in the up and down direction.

In the substrate processing system of the present invention, the second detecting part may include a plurality of detecting components that are disposed correspondingly to the respective accommodating portions of the container, and the respective detecting components of the second detecting part may detect whether the substrates are respectively accommodated in the respective corresponding accommodating portions or not.

At this time, each of the detecting components of the second detecting part may have a light emitting element and a light receiving element that are disposed such that the substrate accommodated in the corresponding accommodating portion is interposed between the light emitting element and the light receiving element.

In the substrate processing system of the present invention, there may be provided a door configured to selectively close an opening accessible to an inside of the container, and the first detecting part and the second detecting part respectively may detect the respective substrates accommodated in the container, when the door opens the opening.

At this time, the door may be moved with respect to the opening, and the first detecting part and the second detecting part may be respectively moved with respect to the opening.

The substrate processing system may further comprise two container tables on which the container can be respectively placed, wherein the container placed on the first container table accommodates the substrates which are not yet processed by the processing part, there is provided a first door configured to selectively close a first opening accessible into the inside of the container placed on the first container table, and the first detecting part is disposed in the vicinity of the first opening, and the container placed on the second container table accommodates the substrates which have been processed by the processing part, there is provided a second door configured to selectively close a second opening accessible into the inside of the container placed on the second container table, and the second detecting part is disposed in the vicinity of the second opening.

At this time, the first detecting part may be disposed on a side opposite to a direction in which the first door is opened with respect to the first opening.

In this case, the first detecting part may be moved with respect to the first opening, and the first detecting part may enter the first opening, while the first opening is being opened by the first door.

The substrate processing system may further comprise a transport part configured to transport the substrates between the container and the processing part, wherein the transport part transports the substrates, which are not yet processed by the processing part, from the container to the processing part, and transports the substrates, which have been processed by the processing part, from the processing part to the container.

Alternatively, the substrate processing system may comprise a first transfer part configured to collectively transfer the substrates, which are not yet processed by the processing part, from the container to the processing part; and a second transfer part configured to collectively transfer the substrate, which have been processed by the processing part, from the processing part to the container.

The substrate detecting apparatus of the present invention is a substrate detecting apparatus configured to detect unprocessed and processed substrates which are accommodated in a container in which a plurality of accommodating portions each of which can accommodate one substrate are arranged in an up and down direction, the substrate detecting apparatus comprising: a first detecting part configured to detect whether the unprocessed substrates are respectively accommodated in the respective accommodating portions of the container or not, and to detect accommodated conditions of the respective unprocessed substrates accommodated in the respective accommodating portions; and a second detecting part configured to collectively detect whether the processed substrates are respectively accommodated in the respective accommodating portions of the container or not.

The substrate detecting method of the present invention is a substrate detecting method performed by a substrate detecting apparatus configured to detect unprocessed and processed substrates which are accommodated in a container in which a plurality of accommodating portions each of which can accommodate one substrate are arranged in an up and down direction, the substrate detecting method comprising: detecting the unprocessed substrates accommodated in the container by a first detecting part, in which whether the substrates are respectively accommodated in the respective accommodating portions of the container or not is detected, and accommodated conditions of the respective substrates accommodated in the respective accommodating portions are detected; and detecting the processed substrates accommodated in the container by a second detecting part, in which whether the substrates are respectively accommodated in the respective accommodating portions of the container or not is collectively detected.

BRIEF DESCRIPTION OF THE DRAWINGS

FIGS. 3(a) and 3(b) are top views of a first detecting part of the substrate detecting apparatus shown in FIG. 2, in which FIG. 3(a) is a view showing that the first detecting part is retracted from a container and FIG. 3(b) is a view showing that the first detecting part is present in the container.

FIGS. 4(a) and 4(b) are side views of the first detecting part of the substrate detecting apparatus shown in FIG. 2, in which FIG. 4(a) is a view showing that the first detecting part is retracted from the container and FIG. 4(b) is a view showing that the first detecting part is present in the container.

FIGS. 5(a) and 5(b) are top views of a second detecting part of the substrate detecting apparatus shown in FIG. 2, in which FIG. 5(a) is a view showing that the second detecting part is retracted from the container and FIG. 5(b) is a view showing that the second detecting part is present in the container.

FIGS. 6(a) to 6(c) are side views of the second detecting part of the substrate detecting apparatus shown in FIG. 2, in which FIG. 6(a) is a view showing that the second detecting part is retracted from the container, FIG. 6(b) is a view showing that the second detecting part is present in the container, and FIG. 6(c) is an enlarged view of sensor support members shown in FIG. 6(a).

DETAILED DESCRIPTION OF THE INVENTION

Figure 1:
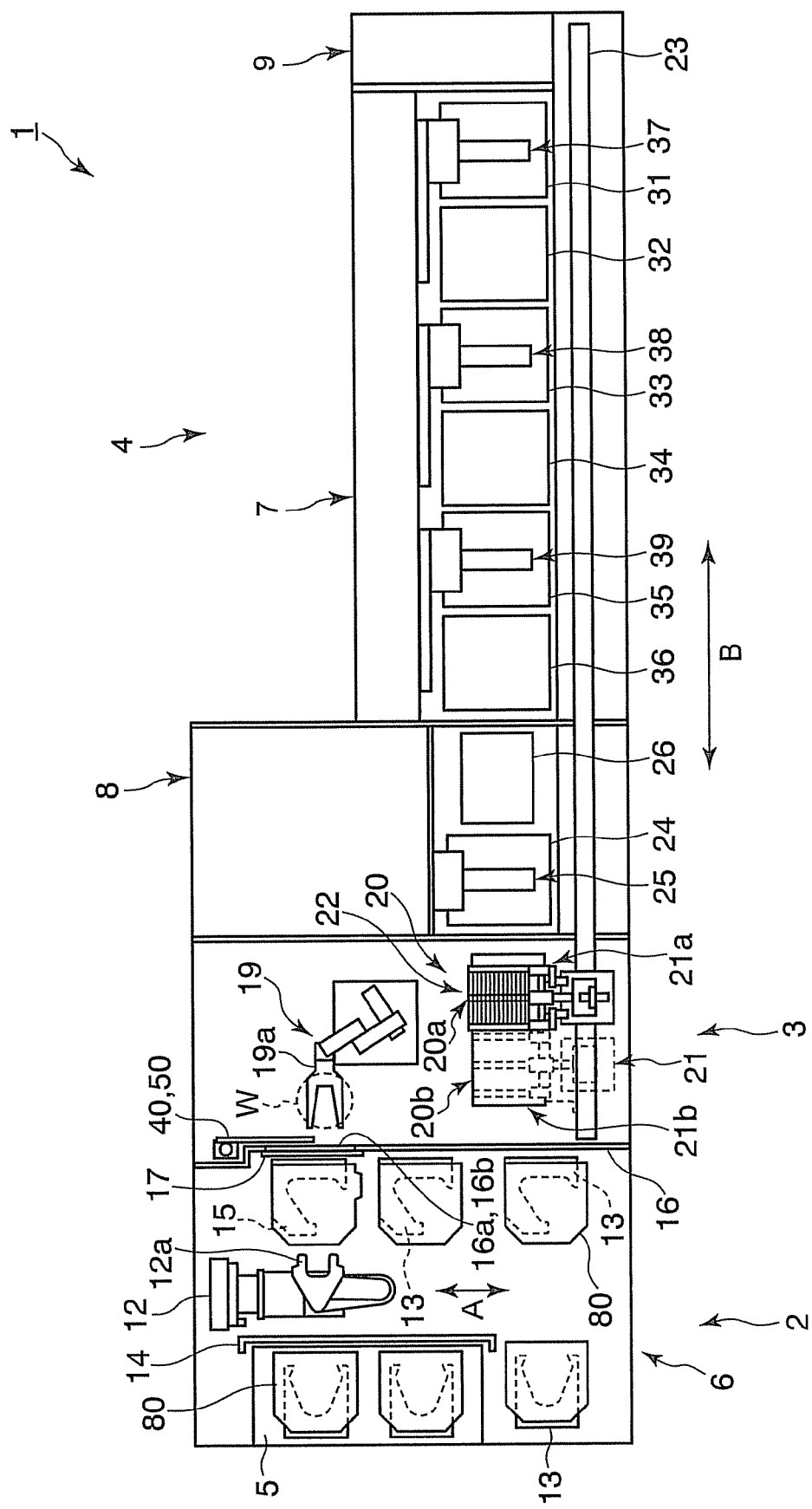
FIG. 1 is a plan view schematically showing a structure of a substrate processing system in one embodiment of the present invention.
Figure 2:
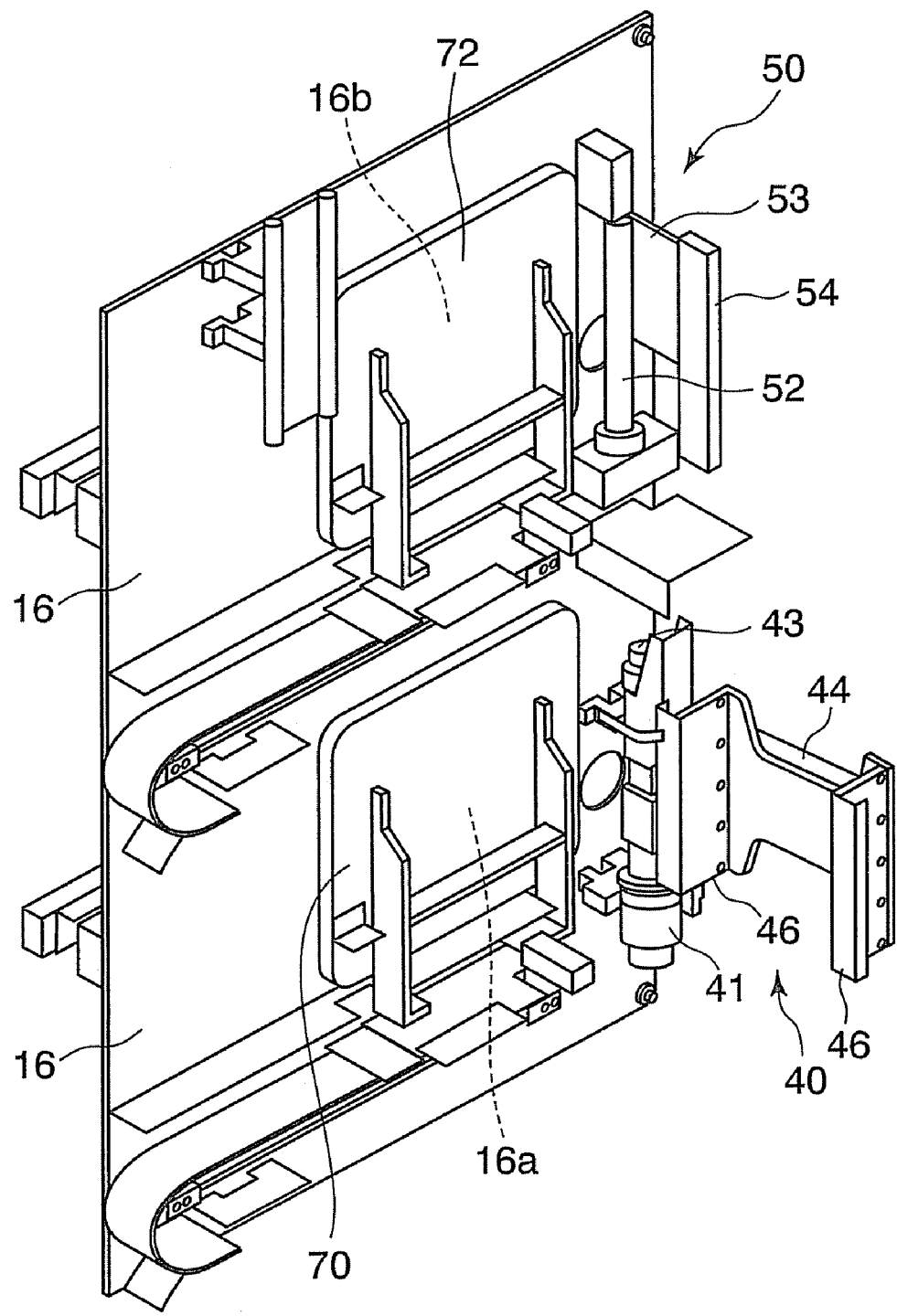
FIG. 2 is a perspective view showing structures of a door disposed on an opening of a wall part and a substrate detecting apparatus of the substrate processing system shown in FIG. 1.
Figure 3:
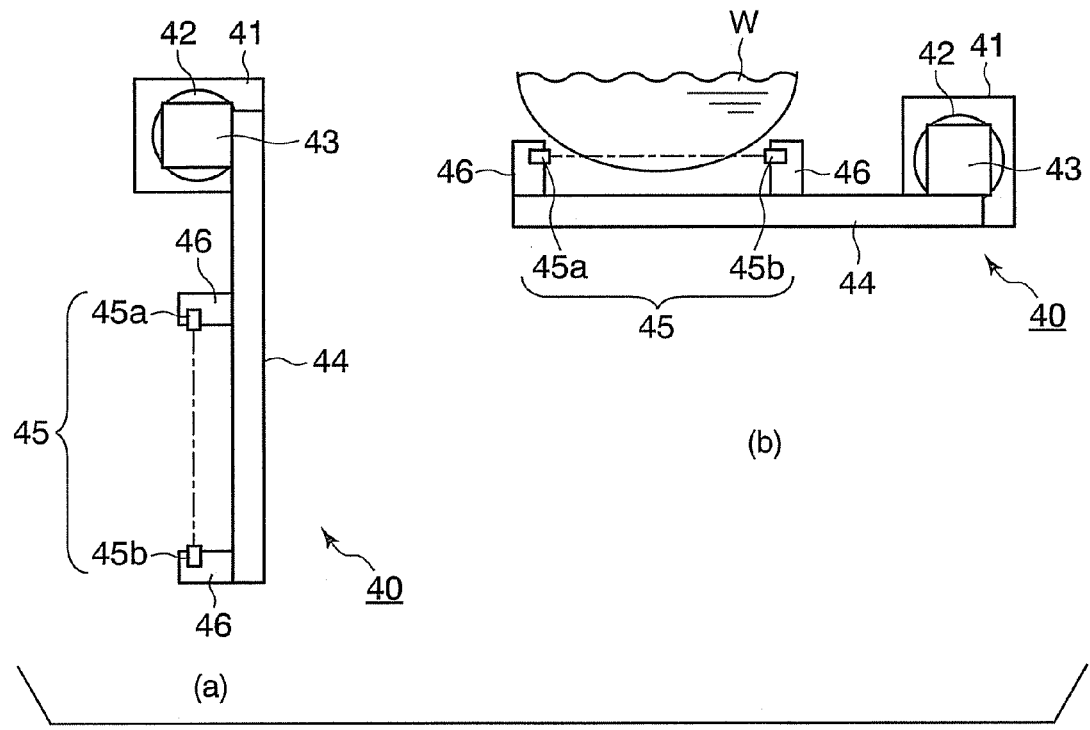
Figure 4:
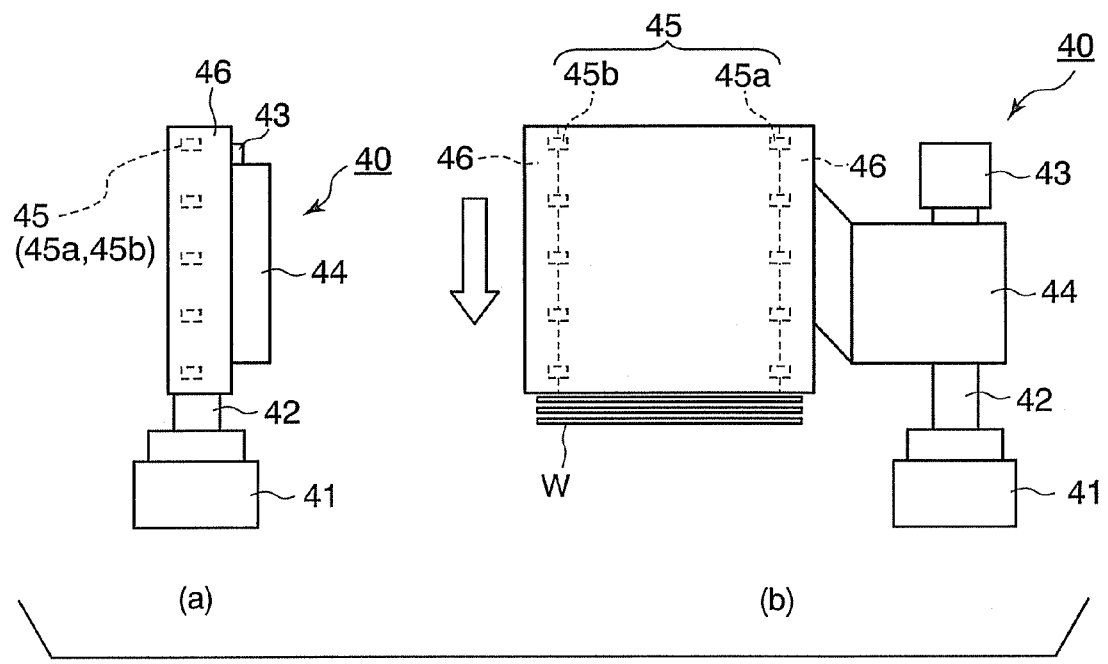
Figure 5:
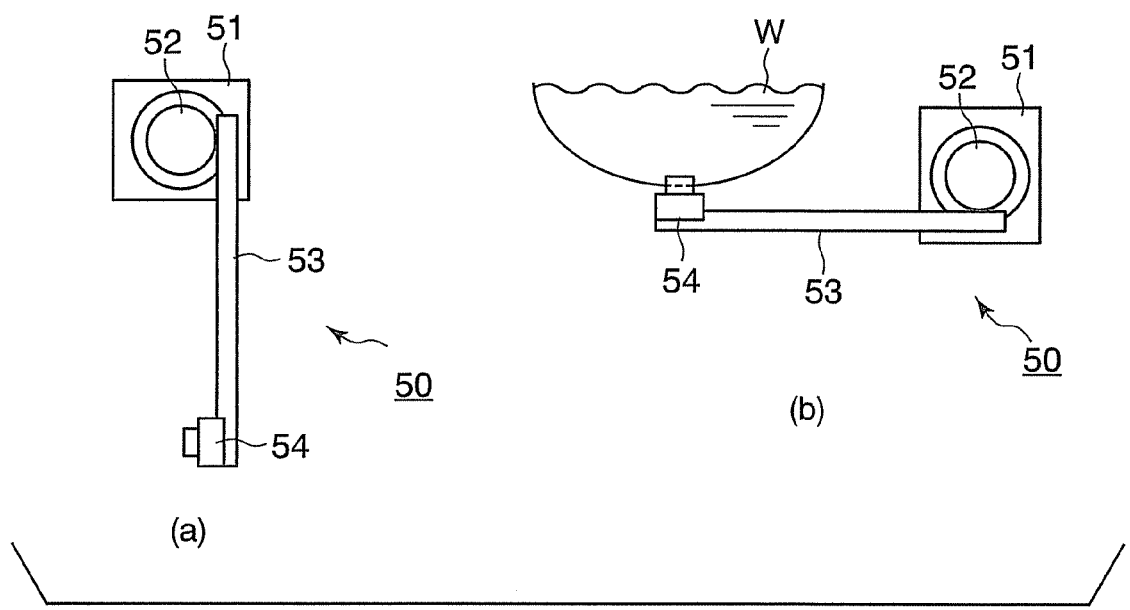
Figure 6:
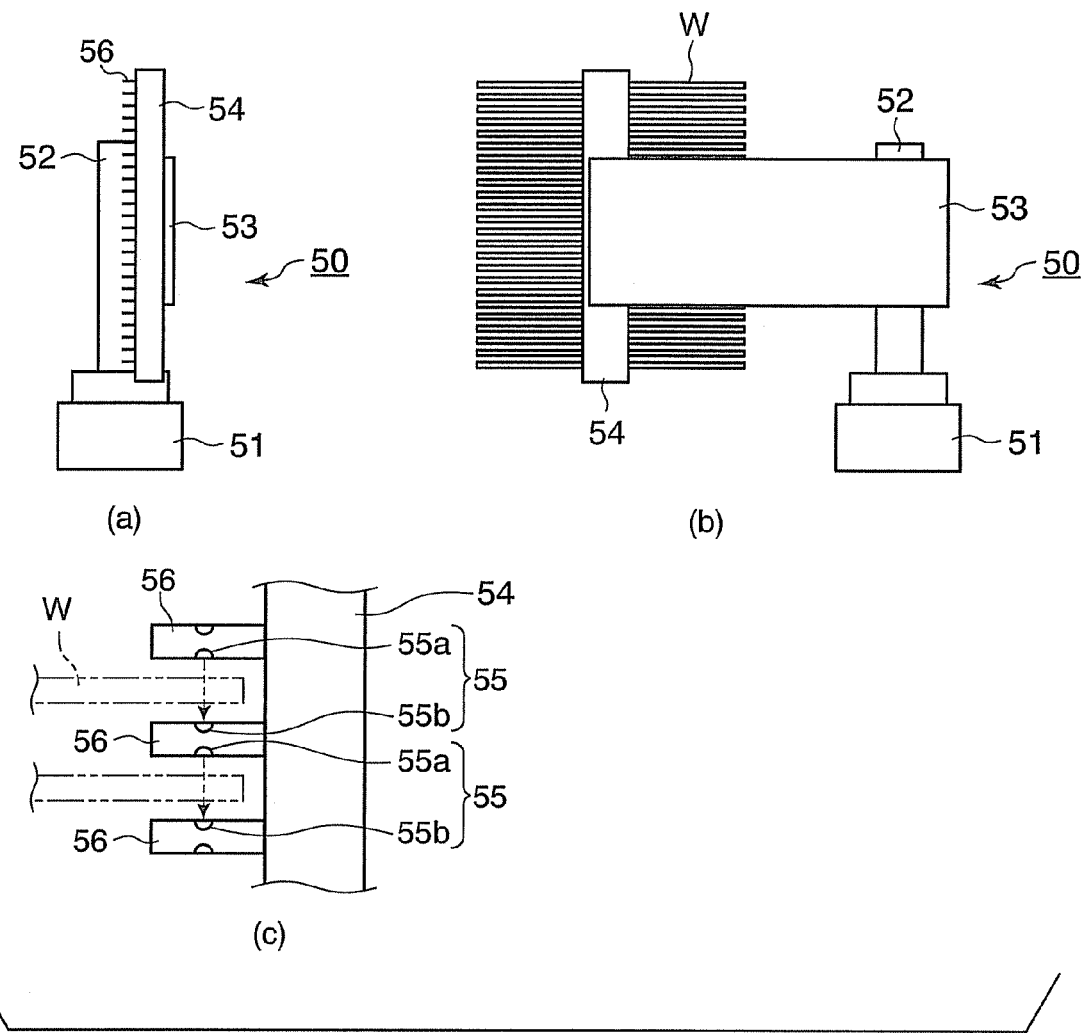
Figure 7:
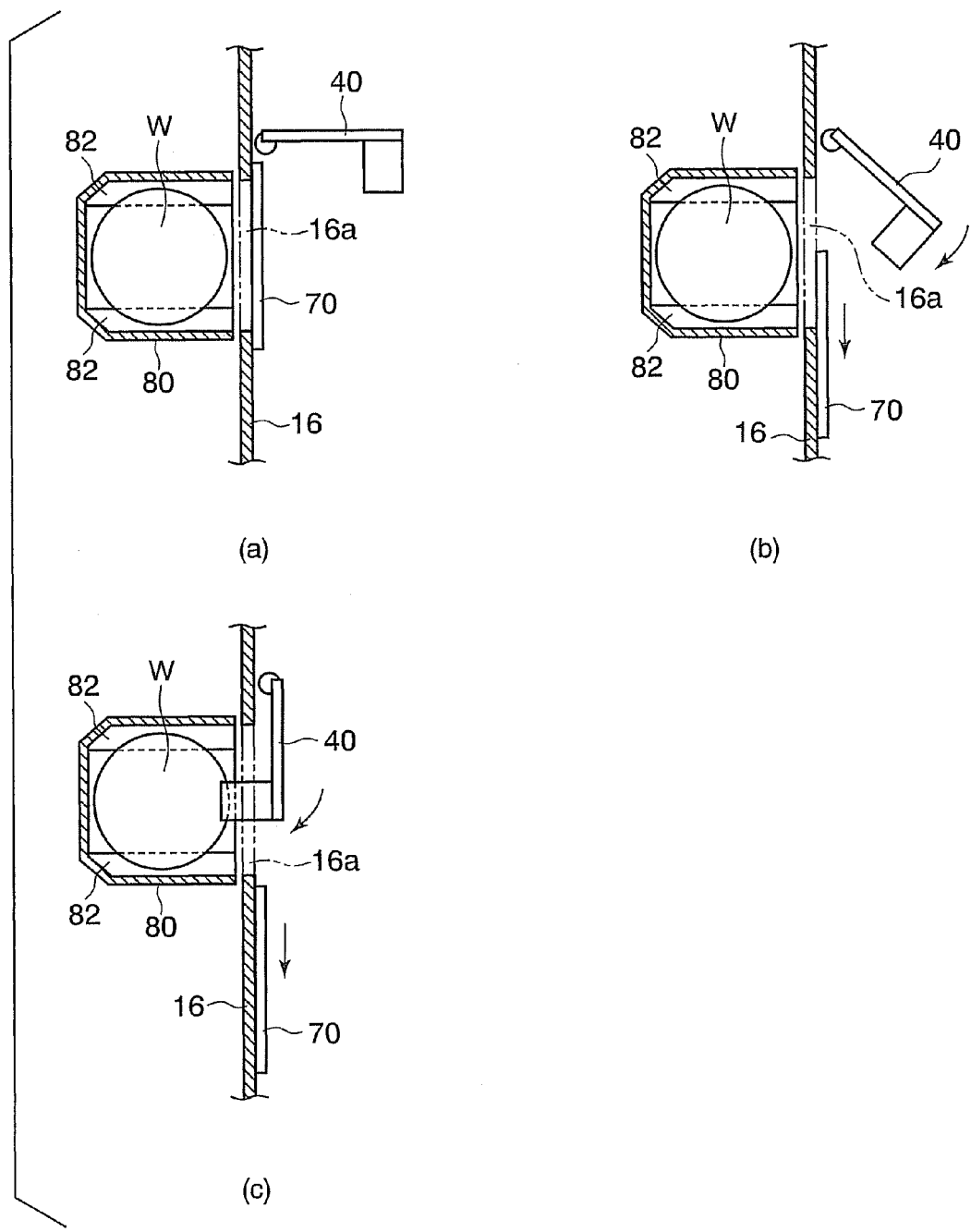
FIGS. 7(a) to 7(c) are top views showing structures and operations of the container, the door disposed on a lower opening of the wall part, and the first detecting part of the substrate processing system shown in FIG. 1.
Figure 8:
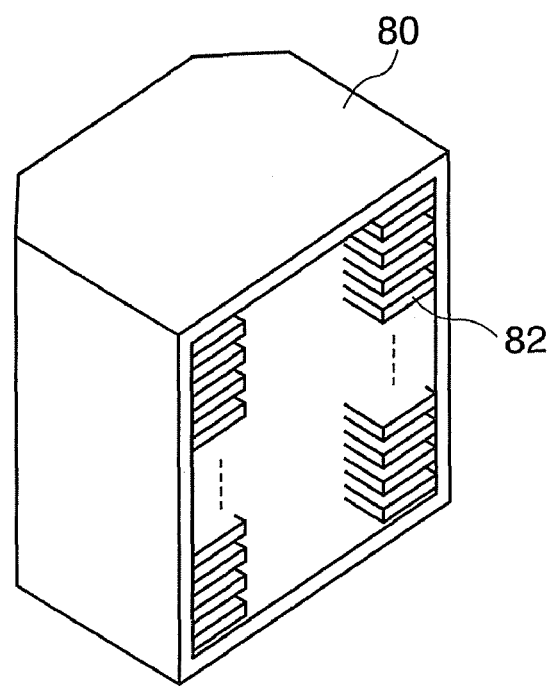
FIG. 8(a) is a perspective view showing the structure of the container.
FIG. 8(b) is a view of a wafer accommodated in the container shown in FIG. 8(a), which is seen from above.
Figure 8:
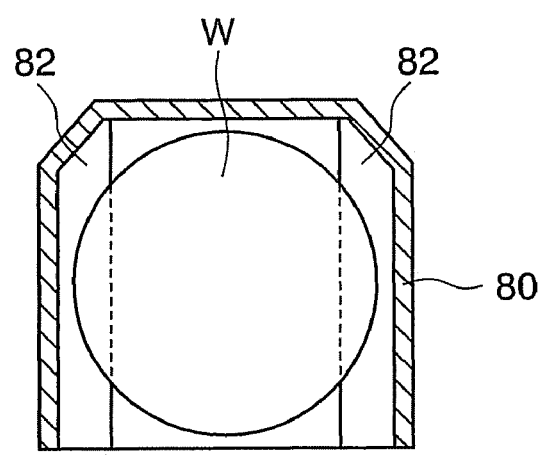

An embodiment of the present invention is described with reference to the drawings. FIGS. 1 to 8 are views showing a substrate detecting apparatus in this embodiment and a substrate processing system comprising the substrate detecting apparatus. FIG. 1 is a plan view schematically showing a structure of a substrate processing system in one embodiment of the present invention. FIG. 2 is a perspective view showing structures of a door disposed on an opening of a wall part and the substrate detecting apparatus of the substrate processing system shown in FIG. 1. FIGS. 3 and 4 are a top view and a side view of a first detecting part of the substrate detecting apparatus shown in FIG. 2. FIGS. 5 and 6 are a top view and a side view of a second detecting part of the substrate detecting apparatus shown in FIG. 2. FIG. 7 is a top view showing structures and operations of the container, the door disposed on a lower opening of the wall part, and the first detecting part of the substrate processing system shown in FIG. 1. FIG. 8 is a view showing the structure of the container.

The substrate processing system in this embodiment is firstly described with reference to FIG. 1. The substrate processing system shown in FIG. 1 is adapted to clean substrates such as semiconductor wafers W (hereinafter referred to as "wafers W") by a batch method (i.e., to simultaneously clean a plurality of, e.g., fifty wafers W).

As shown in FIG. 1, the substrate processing system 1 is composed of: a container loading/unloading part 2 configured to load and unload a container 80 (see, FIG. 8), in which wafers W are arranged in a horizontal state in the up and down direction, and to store the container 80; a cleaning part 4 configured to clean the wafers W with the use of a predetermined chemical liquid, and to dry the cleaned wafers W; and an interface part 3 configured to transfer the wafers W between the container loading/unloading part 2 and the cleaning part 4.

The container loading/unloading part 2 includes: a container loading/unloading stage 5 on which the container 80, which is shown in FIG. 8, which accommodates a plurality of, e.g., twenty five wafers W in a horizontal state with predetermined spaces therebetween in the up and down direction, can be placed; a container stock part 6 configured to stock the container 80; and a container transfer apparatus 12 configured to transfer the container 80. As shown in FIG. 8, the container 80 includes a plurality of (e.g., twenty five) accommodating portions 82 each of which can accommodate one wafer W. The accommodating portions 82 are arranged with predetermined spaces therebetween in the up and down direction. One side surface of the container 80 provides a loading/unloading opening through which a wafer W is loaded and unloaded. The loading/unloading opening can be opened and closed by a lid member (not shown). The container stock part 6 is provided with a plurality of container holding members for holding the container 80. Thus, the plurality of containers 80 can be held by these container holding members 13.

Disposed between the container loading/unloading stage 5 and the container stock part 6 is a shutter 14. The shutter 14 is closed, other than when the container 80 is loaded and unloaded to and from the container loading/unloading stage 5.

As shown in FIGS. 1 and 2, the container stock part 6 and the interface part 3 are separated from each other by a wall part 16. The wall part 16 is provided with openings 16a and 16b which are arranged at two levels in the up and down direction. On a side of the container stock part 6 of the openings 16a and 16b, wafer in-and-out stages 15 on which the containers 80 are respectively placed are disposed at two levels, such that lid members of the containers 80 are faced with the openings 16a and 16b. FIG. 1 shows only one of the wafer in-and-out stages 15 of the upper and lower wafer in-and-out stages 15. The lower opening 16a of the two upper and lower openings 16a and 16b is an opening for unloading, which is used for unloading wafers W from the container 80, and the upper opening 16b is an opening for loading, which is used for loading wafers W into the container 80.

The wafer in-and-out stage 15 has a lid opening/closing mechanism 17 configured to open and close the lid member of the container 80 placed on the wafer in-and-out stage 15. The wafers W in the container 80 can be unloaded to the interface part 3 by the lid opening/closing mechanism 17 that opens the lid member of the container 80 hermetically in contact with the wall part 16. In addition, the wafers W can be loaded from the interface part 3 into the vacant container 80 by the lid opening/closing mechanism 17 that opens the lid member of the container 80 hermetically in contact with the wall part 16.

The container holding members 13 are disposed at a plurality of levels, e.g., two or four levels, in a height direction in the vicinity of the wall part 16. The container stock part 6 has a function for temporarily stocking the container 80 accommodating wafers W that are not cleaned yet, and for stocking the vacant container 80 from which the wafers W have been brought out.

The container transfer apparatus 12 has a polyarticular structure, and is adapted to transfer the container 80 by supporting the container 80 by means of a support arm 12a disposed on an end of the container transfer apparatus 12. The container transfer apparatus 12 is capable of being moved both in the A direction of FIG. 1 and in the height direction, so that the container transfer apparatus 12 is adapted to transfer the container 80 among the container loading/unloading stage 5, the container holding members 13, and the wafer in-and-out stages 15.

As shown in FIGS. 1 and 2, a first detecting part 40 configured to detect unprocessed wafers W in the container 80 is disposed near to the lower opening 16a of the interface part 3. Further, a second detecting part 50 configured to detect processed wafers W in the container 80 is disposed near to the upper opening 16b of the interface part 3. Concrete structures of these first and second detecting parts 40 and 50 will be described hereinbelow. The first detecting part 40 and the second detecting part 50 collectively constitute a substrate detecting apparatus.

The interface part 3 is equipped with a wafer transport apparatus 19 for transporting wafers W and a wafer loading/unloading part 20.

The wafer transport apparatus 19 is configured to send and receive wafers W to and from the container 80 located on the wafer in-and-out stage 15, and to send and receive wafers W to and from an alignment part 21. The wafer transport apparatus 19 has a multiaxial arm structure, and has a plurality of wafer holding arms 19a on an end thereof. The number of the wafers W that the wafer holding arms 19a holds is the same as that of the wafers W in the container 80. Each wafer holding arm 19a has a holding claw (not shown) capable of holding a wafer W. Thus, due to the multiaxial arm structure, while holding the wafer W by the holding claw, the wafer holding arm 19a can occupy a given position with a given posture in a three dimensional space.

The wafer loading/unloading part 20 is adapted to transfer the wafers W between the interface part 3 and the cleaning part 4. The wafer loading/unloading part 20 has a loading position 20a, an unloading position 20b, and the alignment part 21.

The alignment part 21 includes a first alignment mechanism 21a and a second alignment mechanism 21b. The first alignment mechanism 21a is configured to align a plurality of, e.g., fifty unprocessed wafers W corresponding to the wafers in the two containers, which are supplied by the wafer transport apparatus 19, at pitches that are half of pitches in the container 80. The second alignment mechanism 21b is configured to return the half pitches of the wafers W, which have been cleaned at the half pitches, to the pitches (normal pitches) in the container 80.

The wafer transfer apparatus 22 includes three chucks (not shown) in which wafer holding grooves are formed at the half pitches, and thus can hold wafers W aligned at the half pitches, i.e., wafers capable of being accommodated in the two containers. The wafer transfer apparatus 22 can be moved along a guide rail 23 extending from the interface part 3 to the cleaning part 4 in a direction shown by the arrow B in FIG. 1. The wafer transfer apparatus 22 is adapted to receive the unprocessed wafers W in a vertical posture from the wafer transport apparatus 19 at the loading position 20a of the wafer loading/unloading part 20, and to move along the guide rail 23 to the cleaning part 4 so as to load the wafers W to the cleaning part 4. Further, the wafer transfer apparatus 22 is adapted to unload the cleaned wafers W from the cleaning part 4, to move along the guide rail 23 up to the unloading position 20b of the wafer loading/unloading part 20, and to send the processed wafers W to the wafer transport apparatus 19 at the unloading position 20b.

The cleaning part 4 is composed of a cleaning unit 7, a drying unit 8, and a parking area 9. The drying unit 8, the cleaning unit 7, and the parking area 9 are arranged in this order from the interface part 3. The wafer transfer apparatus 22 is adapted to transfer the wafers W thereamong, by moving along the guide rail 23 extending in the direction of the arrow B in FIG. 1.

The parking area 9 is a place where the unprocessed wafers W wait. By utilizing a time when the wafer transfer apparatus 22 is not needed to be operated because the wafers W in a certain lot are in the course of being cleaned or dried, the wafers W to be subsequently cleaned are transferred to the parking area 9. Since the parking area 9 is adjacent to the cleaning unit 7, a time required for transferring the wafers W can be reduced, when starting the cleaning process. Thus, a throughput can be improved.

As shown in FIG. 1, in the cleaning unit 7, a first chemical liquid tank 31, a first water washing tank 32, a second chemical liquid tank 33, a second water washing tank 34, a third chemical liquid tank 35, and a third water washing tank 36 are arranged in this order from the parking area 9. In addition, there are respectively provided a first transfer apparatus 37 configured to transfer the wafers W between the first chemical liquid tank 31 and the first water washing tank 32, a second transfer apparatus 38 configured to transfer the wafers W between the second chemical liquid tank 33 and the second water washing tank 34, and a third transfer apparatus 39 configured to transfer the wafers W between the third chemical liquid tank 35 and the third water washing tank 36.

The first chemical liquid tank 31 stores an SPM liquid (a mixed solution of concentrated sulfuric acid and hydrogen peroxide water) heated at about 130° C. for removing organic stains and for removing surface metal impurities. The second chemical liquid tank 33 stores a chemical liquid, such as an SC-1 liquid (a mixed solution of ammonia, hydrogen peroxide water and water), for removing adhering matters such as particles. The third chemical liquid tank 35 stores an etching liquid, such as diluted fluorine, for etching an oxide film formed on a surface of the wafer W. Alternatively, as an etching liquid, a mixture of fluorine and ammonium fluoride (buffered fluorine (BHF)) may be used, instead of diluted fluorine.

The first to third water washing tanks 32, 34, and 36 are adapted to remove the chemical liquids that adhere to the wafers W by the chemical liquid processes in the respective first to third chemical liquid tanks 31, 33, and 35. For example, various washing methods such as an overflow rinsing and quick damp rinsing are used.

The first transfer apparatus 37 has a driving mechanism capable of being elevated and lowered in the up and down direction. An operation of the first transfer apparatus 37 is as follows. Namely, the first transfer apparatus 37 lowers the wafers W transferred from the wafer transfer apparatus 22 so that the wafers W are immersed into the first chemical liquid tank 31. After a predetermined time has passed, the first transfer apparatus 37 draws up the wafers W. Then, the first transfer apparatus 37 horizontally moves the wafers W so that the wafers W are immersed into the first water washing tank 32. After a predetermined time has passed, the first transfer apparatus 37 draws up the wafers W. The wafers W, which have been processed in the first water washing tank 32, are once returned to the wafer transfer apparatus 22, and thereafter transferred from the wafer transfer apparatus 22 to the second transfer apparatus 38. The second and third transfer apparatuses 38 and 39 have the same structure as that of the first transfer apparatus 37, and are operated in the same manner.

In the drying unit 8, there are disposed a water washing tank 24 and a chuck cleaning mechanism 26 configured to clean the chucks of the wafer transfer apparatus 22. On an upper part of the water washing tank 24, there is disposed a drying chamber (not shown) into which an isopropyl alcohol (IPA) steam is supplied for drying the wafers W. In addition, there is provided a transfer apparatus 25 that transfers the wafers W between the water washing tank 24 and the drying chamber. The wafers W, which have been washed by a water in the water washing tank 24, are drawn up by the transfer apparatus 25 and then are dried by IPA in the drying chamber. The transfer apparatus 25 is structured in the same manner as the first transfer apparatus 37, but the transfer apparatus 25 cannot horizontally move. The transfer apparatus 25 is adapted to transfer the wafers W to and from the wafer transfer apparatus 22.

Next, the first detecting part 40 and the second detecting part 50 of the substrate detecting apparatus are described in detail.

At first, the structure of the first detecting part 40 is described with reference to FIGS. 3 and 4. FIGS. 3(a) and (b)

are top views of the first detecting part 40, in which FIG. 3(a) is a view showing that the first detecting part 40 is retracted from the container 80 and FIG. 3(b) is a view showing that the first detecting part 40 is present in the container 80. FIGS. 4(a) and 4(b) are side views of the first detecting part 40, in which FIG. 4(a) is a view showing that the first detecting part 40 is retracted from the container 80 and FIG. 4(b) is a view showing that the first detecting part 40 is present in the container 80. The first detecting part 40 is configured to detect the wafers W which are accommodated in the container 80, and are not processed yet by the cleaning part 4. To be more specific, the first detecting part 40 is adapted to whether the wafers W are respectively accommodated in the respective accommodating portions 82 of the container 80 or not, and to detect accommodated conditions of the wafers W accommodated in the respective accommodating portions 82. Herein, to detect the accommodated conditions of the wafers W means to detect whether each accommodating portion 82 lacks the wafer W or not, whether the two or more wafers W are overlapped in the one accommodating portion 82 or not, and whether or not the wafer W is inclined, with one end of the wafer W being placed on a certain accommodating portion 82 and the other end of the wafer W being placed on another accommodating portion 82 positioned above or below the certain accommodating portion 82.

The first detecting part 40 is adapted to scan the respective wafers W accommodated in the respective accommodating portions 82 of the container 80. Based on a scanning result, the first detecting part 40 detects whether the wafers W are respectively accommodated in the respective accommodating portions 82 of the container 80 or not, and accommodated conditions of the respective wafers W accommodated in the respective accommodating portions 82. The scanning method of the wafers W will be described hereinbelow.

As shown in FIGS. 3 and 4, the first detecting part 40 includes a rotary actuator 41, a column 42 mounted on an upper part of the rotary actuator 41, a motor 43 disposed on an upper part of the column 42, and an arm 44 provided on the column 42. Two sensor support members 46 extending in the up and down direction are mounted on the arm 44 with a space therebetween. A light emitting element 45a is disposed on the one sensor support member 46, and a light receiving element 45b is disposed on the other sensor support member 46. The light emitting element 45a and the light receiving element 45b constitute a sensor component 45.

In the states shown in FIG. 3(a) and FIG. 4(a), the arm 44 disposed on the column 42 extends in a direction away from the wall part 16 and in a direction perpendicular to the wall part 16. In the states shown in FIG. 3(b) and FIG. 4(b), the arm 44 disposed on the column 42 extends in a direction toward the opening 16a in the wall part 16 and in a direction parallel to the wall part 16.

Herebelow, the respective constituent elements of the first detecting part 40 are described in detail.

The rotary actuator 41 is disposed in the vicinity of an end of the lower opening 16a of the two openings 16a and 16b in the wall part 16 in a width direction. As described above, the cylindrical elongated column 42 is disposed on the upper part of the rotary actuator 41 such that the column 42 extends in the up and down direction. The rotary actuator 41 is configured to rotate the column 42 in opposite directions. To be more specific, the rotary actuator 41 is adapted to rotate the column 42 within a range between a position where the arm 44 mounted on the column 42 is located as shown in FIG. 3(a) and a position where the arm 44 mounted on the column 42 is located as shown in FIG. 3(b) (i.e., within a range of about) 90°.

As shown in FIGS. 3 and 4, the arm 44 is disposed on the column 42. To be more specific, the arm 44 is disposed on the column 42 such that the arm 44 can be moved along the column 42 in the up and down direction (up and down direction in FIGS. 4(a) and 4(b)). The motor 43 disposed on the upper part of the column 42 is configured to move the arm 44 along the column 42 in the up and down direction. The arm 44 is formed of a plate-like member extending in the up and down direction, and extends radially outward from the column 42 when the first detecting part 40 is seen from above. Further, when the first detecting part 40 is seen from above, the arm 44 is configured to be rotated by the rotary actuator 41 about the column 42 in opposite directions within a range of about 90° (within a range between the position shown in FIG. 3(a) and the position shown in FIG. 3(b)).

One of the sensor support members 46 of the two sensor support members 46 is mounted so as to extend in the up and down direction, on one end of the arm 44 in a width direction thereof (right and left direction in FIG. 3(b)), the end being farther from the column 42. In addition, the other sensor support member 46 is mounted on a center area of the arm 44 in the width direction such that the sensor support member 46 extends in the up direction. As shown in FIGS. 3 and 4, the two sensor support members are opposed to each other with a space therebetween.

As shown in FIG. 4(b), in the one of the sensor support members 46, five light emitting elements 45a are arranged in the up and down direction with equal spaces therebetween. In the other of the sensor support members 46, five light receiving elements 45b are arranged in the up and down direction with equal spaces therebetween, correspondingly to the respective light emitting elements 45a. The respective light emitting elements 45a and the respective light receiving elements 45b constitute the respective sensor components 45. That is to say, in the first detecting part 40, the five sensor components 45 are arranged in the up and down direction with equal spaces therebetween.

While the arm 44 is moved upward or downward by the motor 43, the sensor components 45 are adapted to scan the respective wafers W accommodated in the respective accommodating portions 82 of the container 80. More specifically, as shown in FIG. 3(b), the light emitting element 45a and the light receiving element 45b of each sensor component 45 are disposed such that each wafer W accommodated in each accommodating portion 82 of the container 80 is interposed therebetween along the horizontal direction. While the arm 44 is moved upward or downward by the motor 43, each sensor component 45 is adapted to detect each wafer W, based on a condition of a light ray emitted from the light emitting element 45a and received by the light receiving element 45b.

In more detail, the container 80 includes the twenty five accommodating portions 82 along the up and down direction. Since the five sensor components 45 are provided along the up and down direction with equal spaces therebetween, the respective sensor components 45 are moved upward or downward by a distance corresponding to the five accommodating portions 82 in the container 80. During this time, the respective sensor components 45 are adapted to detect whether the wafers W are respectively accommodated in the five accommodating portions 82 or not, and to detect accommodated conditions of the respective wafers W accommodated in the respective accommodating portions 82.

Next, the structure of the second detecting part 50 is described with reference to FIGS. 5 and 6. FIGS. 5(a) and 5(b) are top views of the second detecting part 50, in which FIG. 5(a) is a view showing that the second detecting part is retracted from the container 80, and FIG. 5(b) is a view showing that the second detecting part 50 is present in the container 80. FIGS. 6(a) to 6(c) are side views of the second detecting part 50, in which FIG. 6(a) is a view showing that the second detecting part 50 is retracted from the container 80, FIG. 6(b) is a view showing that the second detecting part 50 is present in the container 80, and FIG. 6(c) is an enlarged view of sensor support members 56 shown in FIG. 6(a). The second detecting part 50 is configured to detect the wafers W which have been processed by the cleaning part 4. To be more specific, the second detecting part 50 is adapted to collectively detect whether the wafers W are respectively accommodated in the respective accommodating portions 82 of the container 80 or not.

As shown in FIGS. 5 and 6, the second detecting part 50 includes a rotary actuator 51, a column 52 mounted on an upper part of the rotary actuator 51, an arm 53 disposed on the column 52, and a mapping sensor 54 mounted on the arm 53. The mapping sensor 54 has a plurality of, e.g., twenty six sensor support members 56 which are disposed in the up and down direction with equal spaces therebetween, so as to correspond to the respective accommodating portions 82 of the container 80. As shown in FIG. 6(c), a light emitting element 55a is disposed on one of the two sensor support members 56 adjacent to each other, and a light receiving element 55b is disposed on the other sensor support member 56 such that the light receiving element 55b is opposed to the aforementioned light emitting element 55a. The light emitting element 55a and the light receiving element 55b are arranged such that the wafer W accommodated in each accommodating portion 82 of the container 80 are interposed therebetween when the second detecting part 50 is present in the container 80. The light emitting element 55a and the light receiving element 55b constitute a sensor component 55.

In the states shown in FIGS. 5(a) and FIG. 6(a), the arm 53 disposed on the column 52 extends in a direction away from the wall part 16 and in a direction perpendicular to the wall part 16. In the states shown in FIG. 5(b) and FIG. 6(b), the arm 53 disposed on the column 52 extends in a direction toward the opening 16b in the wall part 16 and in a direction parallel to the wall part 16.

Herebelow, the respective constituent elements of the second detecting part 50 are described in detail.

The rotary actuator 51 is disposed in the vicinity of an end of the upper opening 16b of the two openings 16a and 16b in the wall part 16 in a width direction. As described above, the cylindrical elongated column 52 is disposed on the upper part of the rotary actuator 51 such that the column 52 extends in the up and down direction. The rotary actuator 51 is configured to rotate the column 52 in opposite directions. To be more specific, the rotary actuator 51 is adapted to rotate the column 52 within a range between a position where the arm 53 mounted on the column 52 is located as shown in FIG. 5(a) and a position where the arm 53 mounted on the column 52 is located as shown in FIG. 5(b) (i.e., within a range of about) 90°.

As shown in FIGS. 5 and 6, the arm 53 is fixedly mounted on the column 52. To be more specific, the arm 53 is formed of a plate-like member extending in the up and down direction, and extends radially outward from the column 52 when the second detecting part 50 is seen from above. Further, when the second detecting part 50 is seen from above, the arm 53 is configured to be rotated by the rotary actuator 51 about the column 52 in opposite directions within a range of about 90° (within a range between the position shown in FIG. 5(a) and the position shown in FIG. 5(b)).

The mapping sensor 54 extending in the up and down direction is mounted on one end of the arm 53 in a width direction thereof (right and left direction in FIG. 5(b)). As described above, the mapping sensor 54 has the plurality of, e.g., twenty six sensor support members 56 which are disposed in the up and down direction with equal spaces therebetween, correspondingly to the respective accommodating portions 82 of the container 80. More specifically, the spaces between the respective sensor support members 56 and the respective accommodating portions 82 of the container 80 correspond to each other. When the second detecting part 50 is present in the container 80, the respective wafers W accommodated in the respective accommodating portions 82 of the container 80 are located in the spaces between the respective sensor support members 56.

As shown in FIG. 6(c), the light emitting element 55a is disposed on one of the two sensor support members 56 adjacent to each other, and the light receiving element 55b is disposed on the other sensor support member 56 such that the light receiving element 55b is opposed to the aforementioned light emitting element 55a. The light emitting element 55a and the light receiving element 55b are arranged such that the wafer W accommodated in each accommodating portion 82 of the container 80 are interposed therebetween when the second detecting part 50 is present in the container 80. In addition, as described above, the light emitting element 55a disposed on the one sensor support member 56 and the light receiving element 55b disposed on the other sensor support member 56 adjacent to the one sensor support member 56 constitute a sensor component 55. That is to say, the sensor components 55 whose number (e.g., twenty five) is the same as the number of the sensor support members 56 are arranged in the up and down direction.

As shown in FIGS. 5(b) and 6(b), when the second detecting part 50 is present in the container 80 and a light ray emitted from the light emitting element 55a is not received by the light receiving element 55b in each sensor component 55, it is judged that the wafer W is accommodated in the accommodating portion 82 of the container 80 corresponding to each sensor component 55.

As shown in FIG. 2, the openings 16a and 16b of the wall part 16 are equipped with a lower door 70 and an upper door 72 that selectively close the openings 16a and 16b, respectively. The respective doors 70 and 72 are adapted to reciprocate between positions, which are shown in FIG. 2 where the doors 70 and 72 close the openings 16a and 16b, and positions where the doors 70 and 72 are retracted from the openings 16a and 16b so as to open the openings 16a and 16b. More specifically, the lower door 70 and the upper door 72 are respectively adapted to reciprocate between the close positions and the open positions along the horizontal direction. The first detecting part is configured to detect the respective wafers W accommodated in the container 80 that is located close to the lower opening 16a, when the lower door 70 opens the lower opening 16a. On the other hand, the second detecting part 50 is configured to detect the respective wafer W accommodated in the container 80 that is located close to the upper opening 16b, when the upper door 72 opens the opening 16b.

Next, an operation of the substrate processing system 1 as structured above is described.

At first, the container 80 accommodating a plurality of, e.g., twenty five wafers W in a horizontal state is placed on the container loading/unloading stage 5. Then, the container 80 on the container loading/unloading stage 5 is transferred by the container transfer apparatus 12 to the wafer in-and-out stage 15 for loading. When the plurality of containers 80 are repeatedly transferred, some of the containers 80 may be temporarily stocked in the container holding members 13 of the container stock part 6 and then transferred, according to need. Then, the lid opening/closing mechanism 17 unlocks the lid member of the container 80 placed on the wafer in-and-out stage 15, and the wafers W in the container 80 are detected by the first detecting part 40 through the opening 16*a* of the wall part 16.

To be more specific, in a state where the opening 16*a* of the wall part 16 is closed by the lower door 70, which is shown in FIG. 7(*a*), and the first detecting part 40 is retracted from the container 80 (see, FIGS. 3(*a*) and 4(*a*)), the lower door 70 starts to move in the horizontal direction (downward in FIG. 7(*a*)), and the rotary actuator 41 starts to drive the column 42 in rotation. Then, the lower door 70 and the first detecting part 40 pass the positions shown in FIG. 7(*b*), and thereafter the lower door 70 reaches the open position and the first detecting part 40 enters the container 80. Namely, the lower door 70 and the first detecting part 40 are moved with respect to the opening 16*a*, such that the first detecting part 40 detects the respective wafers W accommodated in the container 80 at a timing when the lower door 70 opens the opening 16*a*. After the first detecting part 40 has entered the container 80, the first detecting part 40 is located at the position as shown in FIGS. 3(*b*) and 4(*b*) with respect to the container 80. At this time, the wafer W accommodated in each accommodating portion 82 of the container 80 is interposed from the right side and the left side between the light emitting element 45*a* and the light receiving element 45*b* of each sensor component 45 of the first detecting part 40. Then, the arm 44 is moved upward or downward (upward or downward in FIG. 4(*b*)) by the motor 43, and the wafers W are detected by the respective sensor components 45 during this movement.

More specifically, the motor 43 moves the arm 44 upward or downward such that the one sensor component 45 moves a distance corresponding to the five accommodating portions 82. During this movement, the light receiving elements 45*b* continuously receive light rays emitted from the corresponding light emitting elements 45*a*. Based on the light reception conditions, whether the wafers W are accommodated in the respective accommodating portions 82 or not is detected, and accommodated conditions of the wafers W are detected. In the detection of the accommodated conditions of the wafers W by the respective sensor components 45, as described above, the respective sensor components 45 detect whether the two or more wafers W are overlapped in the one accommodating portion 82 or not, and whether or not the wafer W is inclined, with one end of the wafer W being placed on a certain accommodating portion 82 and the other end of the wafer W being placed on another accommodating portion 82 positioned above or below the certain accommodating portion 82, and so on.

After the first detecting part 40 has detected the wafers W in the container 80, the first detecting part 40 returns from the position where the first detecting part 40 is present in the container 80, which is shown in FIGS. 3(*b*) and 7(*c*), to the position where the first detecting part 40 is retracted from the container 80, which is shown in FIGS. 3(*a*) and 7(*a*). During this time, the lower door 70 continuously opens the opening 16*a*.

Thereafter, the wafer holding arm 19*a* of the wafer transport apparatus 19 is inserted through the opening 16*a* into the container 80 on the wafer in-and-out stage 15. The wafers W are then brought out and transferred to the first alignment mechanism 21*a* of the alignment part 21. Simultaneously with this operation, the lid member of the container 80, from which the wafers W have been brought out, which is placed on the wafer in-and-out stage 15, is closed by the lid opening/closing mechanism 17, and the container 80 is then transferred by the wafer apparatus 12 to one of the wafer holding members 13. During this operation, the lower door 70 returns to the position where the opening 16*a* is closed.

After that, the succeeding container 80 placed on the container loading/unloading stage 5 is transferred by the container transfer apparatus 12 to the wafer in-and-out stage 15 for loading. Then, the lid opening/closing mechanism 17 unlocks the lid member of the container 80 placed on the wafer in-and-out stage 15, and the wafers W in the container 80 are detected by the first detecting part 40 through the opening 16*a* of the wall part 16. Then, the wafers W in the container 80 are brought out by the wafer holding arm 19*a* of the wafer transport apparatus 19, and the wafers W are transferred to the first alignment mechanism 21*a*. At this time, the first alignment mechanism 21*a* holds the plurality of, e.g., fifty wafers W corresponding to the two containers, which are aligned at the half pitches, and the first alignment mechanism 21*a* transfers the wafers W to the wafer transfer apparatus 22.

Then, the wafers W corresponding to the two containers, which have been transferred to the wafer transfer apparatus 22 in this manner, are transferred as one lot to the cleaning part 4. Then, the wafers W are subjected to a predetermined cleaning process.

At this time, the wafer transfer apparatus 22 holding the wafers W is moved along the guide rail 23 to the first chemical liquid tank 31 or the first water washing tank 32 of the cleaning unit 7. Then, the wafers W are transferred to the first transfer apparatus 37, and the cleaning process for the wafers W is started. The cleaning process for the wafers W is performed, for example, by immersing the wafers W into the first chemical liquid tank 31, cleaning the wafers W in the first water washing tank 32, immersing the wafers W into the second chemical liquid tank 33, cleaning the wafers in the second water washing tank 34, immersing the wafers W into the third chemical liquid tank 35, and cleaning the wafers W in the third water washing tank 36, in this order.

The wafers W, which have been subjected to the cleaning process in the cleaning process unit 7, are transferred once to the wafer transfer apparatus 22, and transferred to the transfer apparatus 25 of the drying unit 8. Then, the wafers W are subjected to a drying process. The dried wafers W are transferred by the wafer transfer apparatus 22 to the unload position 20*b* of the interface part 3. At this time, the plurality of, e.g., fifty wafers W corresponding to the two containers are transferred under condition that the wafers W are arranged in a vertical posture at the half pitches.

The wafers W corresponding to the two containers, which have been transferred to the unload position 20*b*, are transferred therefrom to the second alignment mechanism 21*b* of the alignment part 21, such that the wafers W are still aligned at the half pitches. Then, the second alignment mechanism 21*b* rearranges the wafers W such that the twenty five wafers W are arranged at the normal pitches so as to be held in the two containers, respectively.

Following thereto, the vacant container 80 is placed by the container transfer apparatus 12 on the wafer in-and-out stage 15 for unloading. The lid member of the container 80 is opened by the lid opening/closing mechanism 17. Then, after a preparation operation of the wafer transport apparatus 19 is performed, the wafer holding arm 19*a* is inserted into the second alignment mechanism 21*b* of the alignment part 21, and the wafers W held in the vertical posture are brought out. Thereafter, the wafer holding arm 19*a* holding the wafers W is inserted through the opening 16*b* of the wall part 16 into, the vacant container 80 on the wafer in-and-out stage 15 for unloading. The wafers W are loaded such that the wafers W take the horizontal posture. After that, the wafer holding arm 19a is retracted from the container 80, and then the wafers W in the container 80 are detected by the second detecting part 50 through the opening 16b of the wall part 16.

When the second detecting part 50 is present in the container 80, the second container 80 is located at the position as shown in FIGS. 5(b) and 6(b) with respect to the container 80. Thus, each wafer W accommodated in the accommodating portion 82 of the container 80 is interposed from the upside and the downside between the light emitting element 55a and the light receiving element 55b of each sensor component 55 of the second detecting part 50.

Then, each sensor component 55 detects whether a light ray emitted from the light emitting element 55a is received by the light receiving element 55b or not. When the light ray is not received by the light receiving element 55b, it is detected that the wafers W are accommodated in the accommodating portions 82 corresponding to the sensor components 55. Herein, the plurality of sensor components 55 are disposed correspondingly to the respective accommodating portions 82 container 80, i.e., the number of the sensor components 55 is the same as that of the accommodating portions 82. Thus, the respective sensor components 55 can collectively detect whether the wafers W are accommodated in the respective accommodating portions 82 of the container 80.

After the detection of the wafers W has been performed by the second detecting part 50, the lid member of the container 80 is closed by the lid opening/closing mechanism 17. After that, the container 80 accommodating the cleaned wafers W is transferred by the container transfer apparatus 12 to the container loading/unloading stage 5.

According to the substrate detecting apparatus in this embodiment and the substrate processing system 1 comprising the substrate detecting apparatus, there are provided the first detecting part 40 for detecting wafers W in an unprocessed condition, and the second detecting part 50 for detecting wafers W in a processed condition. The first detecting part 40 is configured to detect whether the wafers W are respectively accommodated in the respective accommodating portions 82 of the container 80 or not, and to detect accommodated conditions of the respective wafers W accommodated in the respective accommodating portions 82. On the other hand, the second detecting part 50 is configured to collectively detect whether the wafers W are respectively accommodated in the respective accommodating portions 82 of the container 80 or not. In this manner, when the detection of the wafers W accommodated in the container 80 is performed, the unprocessed wafers W and the processed wafers W are detected by the different detecting parts. Thus, as compared with a substrate detecting apparatus that detects unprocessed wafers W and processed wafers W by a common detecting part, the detection of the wafers W can be more appropriately performed.

To be concrete, regarding the unprocessed wafers W, whether the wafers W are respectively accommodated in the respective accommodating portions 82 of the container 80 or not is detected, and accommodated conditions of the respective wafers W accommodated in the respective accommodating portions 82 is also detected. Based on this, the number of the wafers W accommodated in the container 80 can be detected, as well as occurrence of various troubles, which might be caused by the abnormal accommodated condition of the wafer W, can be restrained in the subsequent process steps for the wafers W. On the other hand, regarding the processed wafers W, since there is substantially no possibility that the accommodated conditions of the wafers W becomes abnormal when the wafers W are transferred from the cleaning part 4 to the container 80, it is sufficient to simply detect whether the wafers W are respectively accommodated in the respective accommodating portions 82 of the container 80 or not. Since the wafers W can be collectively detected, a time period required for detecting the wafers W can be significantly reduced. As described above, when the wafers W accommodated in the container 80 are detected, the wafers W in an unprocessed condition and the wafers W in a processed condition are detected by the different detecting parts, whereby a detection result needed for the wafers in the respective conditions can be appropriately obtained, and a detection period for the wafers can be reduced. Thus, a throughput of a process of the wafers W can be improved.

In addition, in the substrate detecting apparatus in this embodiment and the substrate processing system 1, the first detecting part 40 scans the respective wafers W accommodated in the respective accommodating portions 82 of the container, so that the first detecting part 40 detects, based on a scanning result, whether the wafers W are respectively accommodated in the respective accommodating portions 82 of the container 80 or not, and detects accommodated conditions of the respective wafers W accommodated in the respective accommodating portions 82.

To be more concrete, the first detecting part 40 includes the plurality of sensor components 45 disposed along the up and down direction with spaces therebetween, and the motor 43 that synchronically moves the respective sensor components 45 in the up and down direction. While the respective sensor components 45 are moved by the motor 43 in the up and down direction, the respective sensor components 45 of the first detecting part 40 detect the respective wafers W accommodated in the respective accommodating portions 82 of the container 80. In this manner, the plurality of sensor components 45 are provided, and the respective sensor components 45 are synchronically moved by the motor 43. Thus, as compared with a case in which only one sensor component 45 is provided, a time period required for detecting the wafers W can be reduced.

In addition, each of the sensor components 45 of the first detecting part 40 has the light emitting element 45a and the light receiving element 45b which are arranged such that each wafer W accommodated in the accommodating portion 82 is interposed therebetween along the horizontal direction. Each sensor component 45 detects each wafer W based on a condition of a light ray emitted from the light emitting element 45a and received by the light receiving element 45b, while the sensor component 45 is moved upward or downward by the motor 43.

In the substrate detecting apparatus in this embodiment and the substrate processing system 1, the second detecting part 50 includes the plurality of sensor components 55 disposed correspondingly to the respective accommodating portions 82 of the container 80. The sensor components 55 of the second detecting part 50 respectively detect whether the wafers W are accommodated in the corresponding accommodating portions 82 or not. Due to this structure, the second detecting part 50 can collectively detect whether the wafers W are respectively accommodated in the respective accommodating portions 82 of the container 80.

To be more concrete, each sensor component 55 of the second detecting part 50 includes the light emitting element 55a and the light receiving element 55b which are disposed such that the wafer W accommodated in the corresponding accommodating portion 82 is interposed therebetween from the upside and the downside. In each of the sensor component 55, when a light lay emitted from the light emitting element 55a is not received by the light receiving element 55b, it is judged that the wafer W is accommodated in the corresponding accommodating portion 82. Although the light emitting element and the light receiving element are disposed on each sensor component 55 such that the wafer W accommodated in the corresponding accommodating portion 82 is interposed therebetween from the upside and the downside, the wafer W may be interposed therebetween along the horizontal direction.

The container 80 is placed on one of the two wafer in-and-out stages 15 arranged along the up and down direction. The container 80 placed on the lower wafer in-and-out stage 15 accommodates the wafers W which are not yet cleaned by the cleaning part 4. The first detecting part 40 is disposed in the vicinity of the lower wafer in-and-out stage 15. The container placed on the upper wafer in-and-out stage 15 accommodates the wafers W which have been cleaned by the cleaning part 4. The second detecting part 50 is disposed in the vicinity of the upper wafer in-and-out stage 15.

In addition, there are provided the lower door 70 that selectively closes the lower opening 16a accessible to the inside of the container 80 that is placed on the lower wafer in-and-out stage 15, and the upper door 72 that selectively closes the upper opening 16b accessible to the inside of the container 80 that is placed on the upper wafer in-and-out stage 15. The first detecting part 40 is disposed on a side opposite to a direction in which the lower door 70 is opened with respect to the lower opening 16a. The second detecting part 50 is disposed on a side opposite to a direction in which the upper door 72 is opened with respect to the upper opening 16b. While the lower door 70 opens the lower opening 16a, the first detecting part 40 detects the respective wafers W accommodated in the container 80. While the upper door 72 opens the upper opening 16b, the second detecting part 50 detects the respective wafers W accommodated in the container 80.

The lower doors 70 and the upper doors 72 are moved with respect to the openings 16a and 16b, respectively. In addition, the first detecting part 40 and the second detecting part 50 are moved with respect to the openings 16a and 16b, respectively.

As shown in FIGS. 7(a) to 7(c), while the lower door 70 is opening the lower opening 16a, the first detecting part 40 is moved toward the lower opening 16a. Thus, immediately after the lower door 70 opens the opening 16a, the wafers W in the container 80 can be detected, whereby a time period required for detecting the wafers W can be further reduced.

The substrate detecting apparatus in this embodiment and the substrate processing system 1 are not limited to the above example, and can be variously modified.

Figure 9:
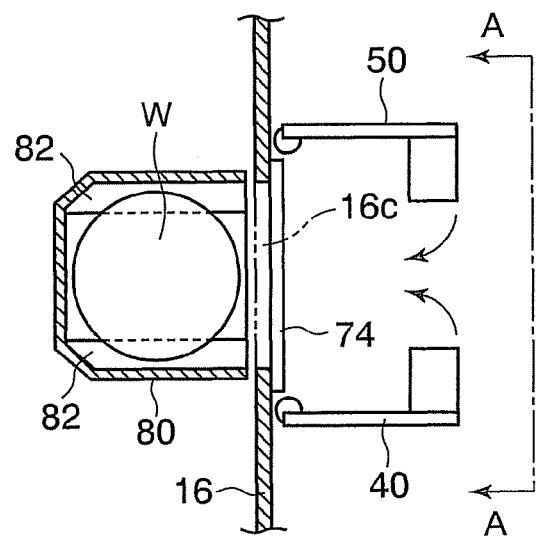
FIG. 9 is a top view showing structures of a container, a door disposed on an opening of a wall part, and a substrate detecting apparatus of a substrate processing system in an alternative example.
Figure 10:
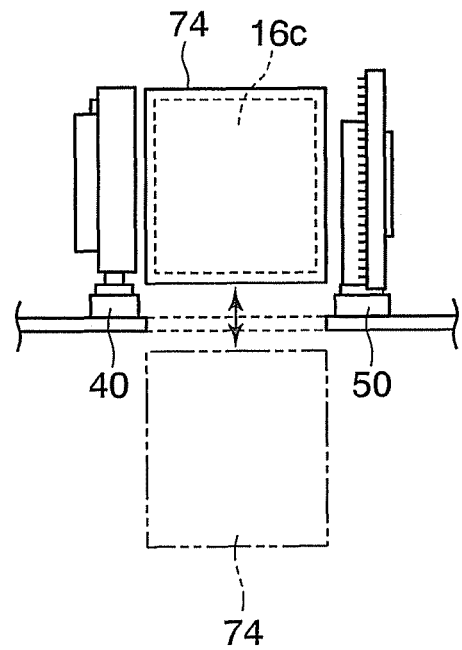
FIG. 10 is a side view taken along the arrow A-A of the substrate processing system shown in FIG. 9.

For example, although the wafer in-and-out stages 15 on which the containers 80 can be placed are arranged at two levels in the up and down direction, the one wafer in-and-out stage 15 may be disposed at one level in the up and down direction. Such a substrate processing system is described with reference to FIGS. 9 and 10. FIG. 9 is a top view showing structures of a container, a door disposed on an opening of a wall part, and a substrate detecting apparatus of the substrate processing system in the alternative example. FIG. 10 is a side view taken along the arrow A-A of the substrate processing system shown in FIG. 9.

In the case in which the wafer in-and-out wafer stage 15 is disposed at only one level in the up and down direction, the wall part 16 is provided with only one opening 16c correspondingly to the wafer in-and-out stage 15. The opening 16c is used both for unloading wafers W from the container 80, and for loading wafers W into the container 80.

As shown in FIG. 9, in the substrate processing system in which each of the wafer in-and-out stage 15 and the opening 16c is disposed at only one level in the up and down direction, the first detecting part 40 and the second detecting part 50 are disposed on opposite ends of the opening 16c in a width direction thereof (up and down direction in FIG. 9). A door 74 for selectively closing the opening 16c is disposed on the opening 16c of the wall part 16. As shown in FIG. 10, the door 74 is adapted to reciprocate along the up and down direction. Specifically, the door 74 is adapted to reciprocate between a close position where the door 74 close the opening 16c (see, solid line in FIG. 10) and an open position where the door 74 is retracted from the opening 16c so as to open the opening 16c (see, two-dot chain lines in FIG. 10).

In the substrate processing system in the alternative example shown in FIGS. 9 and 10, an operation thereof is described when the container 80 accommodating unprocessed wafers W is placed on the wafer in-and-out stage 15, and the wafers W in the container 80 are inspected. At first, the lid member of the container 80 placed on the wafer in-and-out stage 15 is unlocked by the lid opening/closing mechanism 17, and the wafers W in the container 80 are detected by the first detecting part 40 through the opening 16c of the wall part 16.

More specifically, as shown in FIG. 9, in a state where the door 74 closes the opening 16c of the wall part 16 and the first detecting part 40 is retracted from the container 80, the door 74 starts to move downward, and the rotary actuator 41 drives the column 42 in rotation. Then, the door 74 reaches the open position (see, two-dot chain lines in FIG. 10) and the first detecting part 80 enters the container 80. At this time, the door 74 and the first detecting part 40 are moved with respect to the opening 16c, such that the first detecting part 40 detects the respective wafers W accommodated in the container 80 at a timing when the door 74 opens the opening 16c. When the first detecting part 40 is present in the container 80, the wafer W accommodated in each accommodating portion 82 of the container 80 is interposed from the right side and the left side between the light emitting element 45a and the light receiving element 45b of each sensor component 45 of the first detecting part 40. Then, the motor 43 moves the arm 44 in the up and down direction, and the wafers W are scanned by the respective sensor components 45 during this movement. Based on a scanning result of the wafers W, the first detecting part 40 detects whether the wafers W are accommodated in the respective accommodating portions 82 or not, and detects accommodated conditions of the wafers W.

After the first detecting part 40 has detected the wafers W in the container 80, the first detecting part 40 returns from the position in the container 80 to the position at which the first detecting part 40 is retracted from the container 80. During this time, the door 74 continuously opens the opening 16c.

Thereafter, the wafer holding arm 19a of the wafer transport apparatus 19 is inserted through the opening 16c into the container 80 on the wafer in-and-out stage 15. The wafers W are then brought out and transferred to the first alignment mechanism 21a of the alignment part 21. Simultaneously with this operation, the lid member of the container 80, from which the wafers W have been brought out, which is placed on the wafer in-and-out stage 15, is closed by the lid opening/closing mechanism 17, and the container 80 is then transferred by the wafer apparatus 12 to one of the wafer holding members 13. During this operation, the lower door 74 returns to the position where the opening 16c is closed.

Next, in the substrate processing system in the alternative example shown in FIGS. 9 and 10, an operation thereof is described when processed wafers W are returned to the container 80, and the wafers W in the container 80 are inspected. At first, the vacant container 80 is placed by the container transfer apparatus 12 on the wafer in-and-out stage 15. The lid member of the container 80 is opened by the lid opening/ closing mechanism 17. Then, the wafer holding arm 19a holding the wafers W is inserted into the vacant container 80 placed on the wafer in-and-out stage 15 through the opening 16c of the wall part 16, so as to load the wafers W thereinto in a horizontal posture. After that, the wafer holding arm 19a is retracted from the container 80, and the wafers W in the container 80 are detected by the second detecting part 50 through the opening 16c of the wall part 16.

When the second detecting part 50 is present in the container 80, the wafer W accommodated in each accommodating portion 82 of the container 80 is interposed from the upside and the downside between the light emitting element 55a and the light receiving element 55b of each sensor component 55 of the second detecting part 50.

Then, each sensor component 55 detects whether a light ray emitted from the light emitting element 55a is received by the light receiving element 55b or not. When the light ray is not received by the light receiving element 55b, it is detected that the wafers W are accommodated in the accommodating portions 82 corresponding to the sensor components 55. Herein, the plurality of sensor components 55 are disposed correspondingly to the respective accommodating portions 82 container 80, i.e., the number of the sensor component 55 is the same as that of the accommodating portions 82. Thus, the respective sensor components 55 can collectively detect whether the wafers W are accommodated in the respective accommodating portions 82 of the container 80 or not.

After the detection of the wafers W has been performed by the second detecting part 50, the lid member of the container 80 is closed by the lid opening/closing mechanism 17. After that, the container 80 accommodating the cleaned wafers W is transferred by the container transfer apparatus 12 to the container loading/unloading stage 5.

Although the wafer in-and-out stages 15 on which the containers 80 can be placed are disposed at two levels in the up and down direction or the one wafer in-and-out stage 15 is disposed at one level in the up and down direction, the two wafer in-and-out stages 15 may be arranged in the right and left direction. In this case, the wall part 16 is provided with two openings which are arranged in the right and left direction, and there are provided two doors for selectively closing the respective openings. Similarly to the door 74 shown in FIG. 10, these doors are configured to reciprocate along the up and down direction. Specifically, the two doors arranged in the right and left direction are configured to reciprocate between close positions where the doors close the corresponding openings and open positions where the doors are retracted from the corresponding openings so as to open the openings, respectively. The first detecting part 40 is moved with respect to the one opening, and the second detecting part 50 is moved with respect to the other opening.

Next, an alternative example of the substrate processing system is described. In the substrate processing system in the alternative example, the interface part 3 is equipped with two wafer transport apparatuses. The one wafer transport apparatus is adapted to bring out unprocessed wafers W from the container 80 placed on the wafer in-and-out stage 15, and to transfer the brought out wafers W to the first alignment mechanism 21a of the alignment part 21. The other wafer transport apparatus is adapted to transfer processed wafers W held by the second alignment mechanism 21b of the alignment part 21 to the vacant container 80 placed on the wafer in-and-out stage 15.

The invention claimed is:

1. A substrate processing system configured to bring out substrates from a container in which a plurality of accommodating portions each of which can accommodate one substrate are arranged in an up and down direction, to process the substrates, and to return the processed substrates to the container, the substrate processing system comprising:
a processing part configured to process the substrates;
a first detecting part configured to detect, before the substrates are processed by the processing part, whether the substrates are respectively accommodated in the respective accommodating portions of the container or not, and to detect accommodated conditions of the respective substrates accommodated in the respective accommodating portions; and
a second detecting part configured to collectively detect, after the substrates have been processed by the processing part, whether the substrates are respectively accommodated in the respective accommodating portions of the container or not.

2. The substrate processing system according to claim 1, wherein
the first detecting part scans the respective substrates accommodated in the respective accommodating portions of the container, so as to detect whether the substrates are respectively accommodated in the respective accommodating portions of the container, and to detect accommodated conditions of the respective substrates accommodated in the respective accommodating portions, based on a scanning result.

3. The substrate processing system according to claim 2, wherein
the first detecting part includes a plurality of detecting components that are disposed with spaces therebetween along the up and down direction, and a driving mechanism configured to synchronically move the respective detecting parts in the up and down direction, and
the respective detecting components of the first detecting part detect the respective substrates accommodated in the respective accommodating portions of the container, while the detecting components are moved by the driving mechanism in the up and down direction.

4. The substrate processing system according to claim 3, wherein
each of the detecting components of the first detecting part has a light emitting element and a light receiving element that are disposed such that each substrate accommodated in each accommodating portion is interposed between the light emitting element and the light receiving element along a horizontal direction, and
each of the detecting components detects each substrate based on a light reception condition of a light ray emitted from the light emitting element and received by the light receiving element, while the detecting component is moved by the driving mechanism in the up and down direction.

5. The substrate processing system according to claim 1, wherein
the second detecting part includes a plurality of detecting components that are disposed correspondingly to the respective accommodating portions of the container, and
the respective detecting components of the second detecting part detect whether the substrates are respectively accommodated in the respective corresponding accommodating portions or not.

6. The substrate processing system according to claim 5, wherein
each of the detecting components of the second detecting part has a light emitting element and a light receiving element that are disposed such that the substrate accommodated in the corresponding accommodating portion is interposed between the light emitting element and the light receiving element.

7. The substrate processing system according to claim 1, wherein
there is provided a door configured to selectively close an opening accessible to an inside of the container, and
the first detecting part and the second detecting part respectively detect the respective substrates accommodated in the container, when the door opens the opening.

8. The substrate processing system according to claim 7, wherein
the door is moved with respect to the opening, and
the first detecting part and the second detecting part are respectively moved with respect to the opening.

9. The substrate processing system according to claim 1, further comprising two container tables on which the container can be respectively placed, wherein
the container placed on the first container table accommodates the substrates which are not yet processed by the processing part, there is provided a first door configured to selectively close a first opening accessible into the inside of the container placed on the first container table, and the first detecting part is disposed in the vicinity of the first opening, and
the container placed on the second container table accommodates the substrates which have been processed by the processing part, there is provided a second door configured to selectively close a second opening accessible into the inside of the container placed on the second container table, and the second detecting part is disposed in the vicinity of the second opening.

10. The substrate processing system according to claim 9, wherein
the first detecting part is disposed on a side opposite to a direction in which the first door is opened with respect to the first opening.

11. The substrate processing system according to claim 10, wherein
the first detecting part is moved with respect to the first opening, and
the first detecting part enters the first opening, while the first opening is being opened by the first door.

12. The substrate processing system according to claim 1, further comprising a transport part configured to transport the substrates between the container and the processing part, wherein
the transport part transports the substrates, which are not yet processed by the processing part, from the container to the processing part, and transports the substrates, which have been processed by the processing part, from the processing part to the container.

13. The substrate processing system according to claim 1, comprising:
a first transfer part configured to collectively transfer the substrates, which are not yet processed by the processing part, from the container to the processing part; and
a second transfer part configured to collectively transfer the substrate, which have been processed by the processing part, from the processing part to the container.

14. A substrate detecting apparatus configured to detect unprocessed and processed substrates which are accommodated in a container in which a plurality of accommodating portions each of which can accommodate one substrate are arranged in an up and down direction, the substrate detecting apparatus comprising:
a first detecting part configured to detect whether the unprocessed substrates are respectively accommodated in the respective accommodating portions of the container or not, and to detect accommodated conditions of the respective unprocessed substrates accommodated in the respective accommodating portions; and
a second detecting part configured to collectively detect whether the processed substrates are respectively accommodated in the respective accommodating portions of the container or not.

15. A substrate detecting method performed by a substrate detecting apparatus configured to detect unprocessed and processed substrates which are accommodated in a container in which a plurality of accommodating portions each of which can accommodate one substrate are arranged in an up and down direction, the substrate detecting method comprising:
detecting the unprocessed substrates accommodated in the container by a first detecting part, in which whether the substrates are respectively accommodated in the respective accommodating portions of the container or not is detected, and accommodated conditions of the respective substrates accommodated in the respective accommodating portions are detected; and
detecting the processed substrates accommodated in the container by a second detecting part, in which whether the substrates are respectively accommodated in the respective accommodating portions of the container or not is collectively detected.

* * * * *